(12) United States Patent
Suzuki et al.

(10) Patent No.: US 7,568,957 B2
(45) Date of Patent: Aug. 4, 2009

(54) RELAY CONNECTOR

(75) Inventors: Hisashi Suzuki, Tokyo (JP); Ryoichi Hirako, Tokyo (JP)

(73) Assignee: Yokowo Co, Ltd., Tokyo (JP)

( * ) Notice: Subject to any disclaimer, the term of this patent is extended or adjusted under 35 U.S.C. 154(b) by 0 days.

(21) Appl. No.: 11/979,733

(22) Filed: Nov. 7, 2007

(65) Prior Publication Data

US 2008/0113527 A1 May 15, 2008

(30) Foreign Application Priority Data

Nov. 10, 2006 (JP) .............................. 2006-305364

(51) Int. Cl.
*H01R 13/11* (2006.01)
(52) U.S. Cl. ...................................... 439/842
(58) Field of Classification Search ................. 324/761, 324/754–755; 700/284; 439/441
See application file for complete search history.

(56) References Cited

U.S. PATENT DOCUMENTS

| | | | |
|---|---|---|---|
| 4,225,819 A | 9/1980 | Grau et al. ................... 324/415 |
| 4,471,298 A | 9/1984 | Frohlich | |
| 5,642,054 A * | 6/1997 | Pasiecznik, Jr. ............. 324/754 |
| 5,764,069 A * | 6/1998 | Cugini ......................... 324/761 |
| 7,257,465 B2 * | 8/2007 | Perez et al. .................. 700/284 |
| 2004/0239351 A1 | 12/2004 | Sawada et al. ............... 324/754 |
| 2006/0084290 A1 | 4/2006 | Nagashima .................... 439/71 |

FOREIGN PATENT DOCUMENTS

| | | |
|---|---|---|
| EP | 0 919 820 A2 | 6/1999 |
| JP | 11-183521 A | 7/1999 |
| JP | 2004-273192 | 9/2004 |
| JP | 2007-294146 A | 11/2007 |
| WO | WO 2004-059329 A1 | 7/2004 |

* cited by examiner

*Primary Examiner*—Jean F Duverne
(74) *Attorney, Agent, or Firm*—Morgan, Lewis & Bockius LLP (57) ABSTRACT

A relay connector electrically connects terminals which are arranged in two rows on a connector to be inspected provided on a board for inspection to a measuring instrument. The relay connector includes first probes, mounted on a first pin block so as to be contacted with one row of the terminals arranged on the connector to be inspected, and second probes, mounted on a second pin block so as to be contacted with the other row of the terminals arranged on the connector to be inspected. The first and second pin blocks can approach and separate with respect to each other and a distance between the first and second pin blocks can be adjusted and fixed, so that the first and second probes are respectively contacted with the terminals which are arranged in two rows on the connector to be inspected.

7 Claims, 12 Drawing Sheets

RELAY CONNECTOR

BACKGROUND OF THE INVENTION

The present invention relates to a relay connector to be used for electrically connecting a connector to be inspected which is arranged on an inspection board for an electronic component or the like, to a measuring instrument.

In some of compact electronic devices such as a mobile phone and a digital camera, a plurality of boards are superposed on one another for the purpose of mounting many electronic circuits in a small space, and these boards are electrically connected by way of connectors which are respectively provided thereon. In order to inspect the boards and the connectors provided thereon, it has been conducted to electrically connect a measuring instrument or the like to the connectors by appropriate means. In order to inspect a whole unit of the board to be inspected and the connector to be inspected, it is desirable that the connector to be inspected is engaged with a jig-side connector to be mated, and then, they are electrically connected to the measuring instrument. However, in both of the connector to be inspected and the jig-side connector, the number of durable times for engagements and extractions is relatively small, that is, about 50 times. Therefore, the jig-side connector must be exchanged, every time when the number of times of inspections has reached the certain durable number. Provided that the jig-side connector is fixed to a jig-side board by soldering, and a number of wiring cables connected to the measuring instrument are soldered to the jig-side board, it is difficult to exchange only the jig-side connector. Therefore, the whole unit of the jig-side connector, the jig-side board, and the wiring cables must be exchanged inevitably. Consequently, there occurs such inconvenience that cost for measuring and inspection is increased.

In view of the above, the applicant of the invention has already proposed an art as disclosed in JP-A-2004-273192, and reduced the cost for the measuring and inspection, by decreasing parts to be exchanged. In this art which has been already proposed, the jig-side connector to be mated with the connector to be inspected is provided on an insulating relay board, and this insulating relay board is detachably mounted on a probe unit formed of insulating material. Probes are provided in this probe unit. Terminals of the jig-side connector are electrically connected to terminals provided on the insulating relay board, and the probes in the probe unit are brought into contact with the terminals on the insulating relay board for electrical connection. Other ends of the probes provided on the probe unit are electrically connected to a number of wiring cables to be connected to the measuring instrument by appropriate means. As the results, the connector to be inspected is electrically connected to the measuring instrument, by way of the jig-side connector, the insulating relay board, the probes, and the wiring cables. Accordingly, when the number of times of inspections has reached the certain durable number, only the jig-side connector and the insulating relay board may be exchanged, and the cost for the inspection can be reduced in proportion to decrease of the parts to be exchanged.

In the art proposed in the above described JP-A-2004-273192, it would be sufficient that only the jig-side connector and the insulating relay board are exchanged, and the cost for the inspection can be reduced, as compared with the above mentioned related art. However, this is not absolutely satisfactory. Under the circumstances, the inventors considered that the cost for the measuring and inspection can be reduced more with a structure in which the probes are directly brought into contact with the terminals of the connector to be inspected. In this structure, the jig-side connector and the insulating relay board need not be exchanged, and when the probe to be contacted is broken, only the relevant probe may be exchanged.

As an connector to be inspected, connectors in which the terminals are arranged in two rows are often used. However, they have various distances between the two rows. Therefore, it is desired to provide a relay connector which can easily deal with the connectors to be inspected having various distances between the two rows of the terminals.

SUMMARY

It is therefore an object of the invention to a relay connector for bringing probes into contact with an connector to be inspected, in which a distance between the probes can be adjusted according to a distance between terminals arranged in two rows on the connector to be inspected.

In order to achieve the object, according to the invention, there is provided a relay connector, adapted to electrically connect terminals which are arranged in two rows on a connector to be inspected provided on a board for inspection to a measuring instrument, the relay connector comprising:

first probes, mounted on a first pin block comprised of insulating material so as to be contacted with one row of the terminals arranged on the connector to be inspected, and second probes, mounted on a second pin block comprised of insulating material so as to be contacted with the other row of the terminals arranged on the connector to be inspected, wherein the first and second pin blocks can approach and separate with respect to each other and a distance between the first and second pin blocks can be adjusted and fixed, so that the first and second probes are respectively contacted with the terminals which are arranged in two rows on the connector to be inspected.

The first pin block may be formed with an insertion hole into which the second pin block is inserted so as to move only in a direction in which the first and second pin blocks approaches and separates with respect to each other, a position of the second pin block may be adjusted in a state that the second pin block is inserted into the insertion hole, and a positioning pin perpendicular to the direction may be inserted into the second pin block by passing through a wall of the insertion hole from outside of the insertion hole, whereby the second pin block is fixed to the first pin block.

The first pin block may be formed with an insertion hole into which the second pin block is inserted so as to move only in a direction in which the first and second pin blocks approaches and separates with respect to each other, a spacer may be interposed between an inner wall of the insertion hole at one side in the direction and the second pin block, and a position of the second pin block may be adjusted by adjusting a thickness of said spacer, whereby the second pin block is fixed to the first pin block.

BRIEF DESCRIPTION OF THE DRAWINGS

FIGS. 13A and 13B show a structure for pressing the wiring board to the base member by means of ribs provided on the hinge member, in which FIG. 13A is a side view partly cut away, and FIG. 13B is a back view.

DETAIL DESCRIPTION OF PREFERRED EMBODIMENTS

Now, a first embodiment of the invention will be described referring to FIGS. 1 to 14.

In FIGS. 1 to 14, a relay connector in the first embodiment of the invention is constructed in the following manner. As a first step, a hinge member 12 is fixed to a base member 10 with a screw 10a. A pressure operating member 14 is provided on this hinge member 12 so as to swing by means of a swing shaft 16 which is passed through the pressure operating member 14. A compression spring 18 is provided in a contracted state between a rear part of the pressure operating member 14 and the hinge member 12. Moreover, a pressure block 22 is provided at a distal end side of the pressure operating member 14 so as to swing by means of a second swing shaft 20 which is passed through the operating member 14 in parallel with the swing shaft 16. In addition, a floating guide 26 formed of insulating material is arranged on a pin block 24 formed of insulating material so as to approach and separate with respect to each other linearly substantially in a swinging direction of the pressure operating member 14 at its distal end side, while a distance in a separating direction is restricted. Further, a wiring board 28 is fixed to the pin block 24 with a screw 28a at an opposite side to the floating guide 26. The pin block 24 and the wiring board 28 are fixed to the base member 10 with a screw 24a, setting the wiring board 28 at a side of the base member 10. An engage receiving part 26f is projected from the floating guide 26, and an engaging projection 14a is projected from the pressure operating member 14 so that the engage receiving part 26f may be engaged with the engaging projection 14a in an open state of the pressure operating member 14. Consequently, in the open state of the pressure operating member 14, and the movement of the floating guide 26 toward the pin block 24 is restricted. Moreover, a backward end of the pressure operating member 14 is butted against the hinge member 12 in its open state thereby to restrain the swing motion, and the butted part of the hinge member 12 functions as a restraining part.

Figure 1:
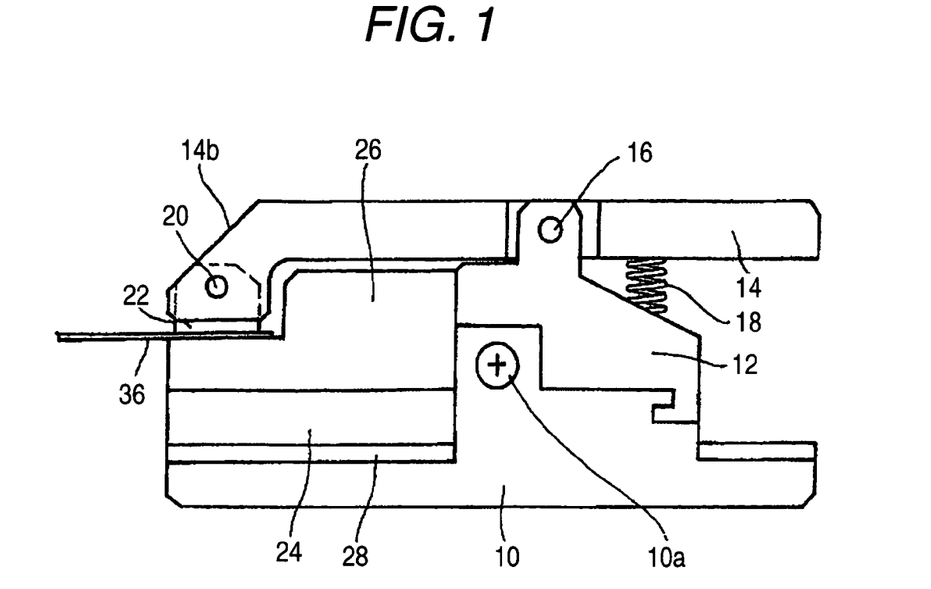
FIG. 1 is a side view of a relay connector in a pressed state in a first embodiment according to the invention.
Figure 2:
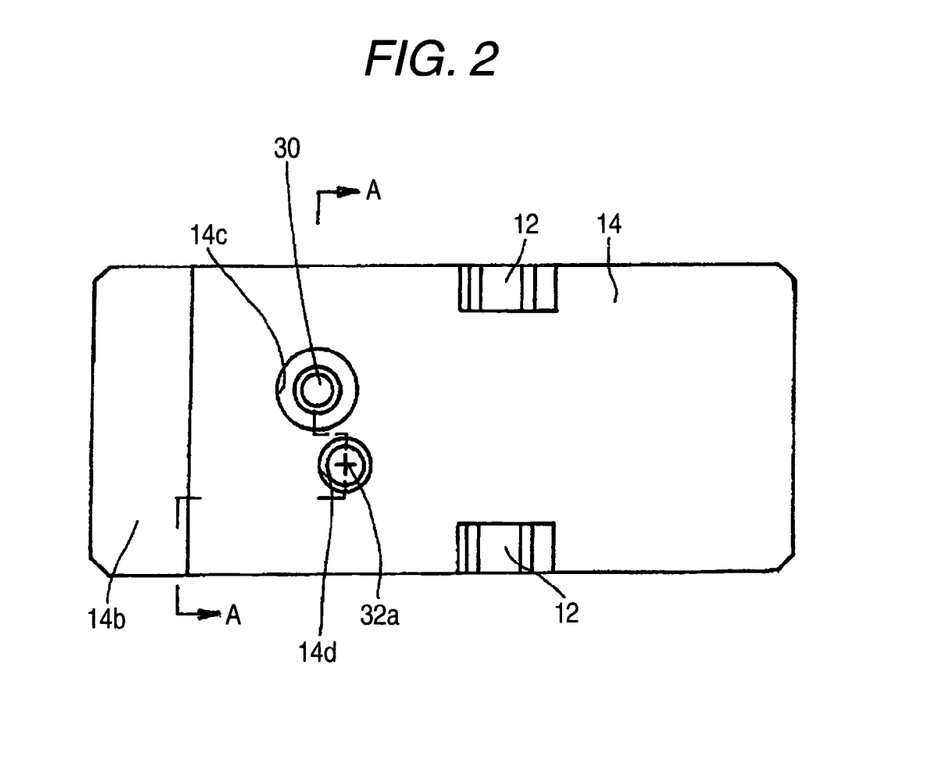
FIG. 2 is a plan view of FIG. 1.
Figure 3:
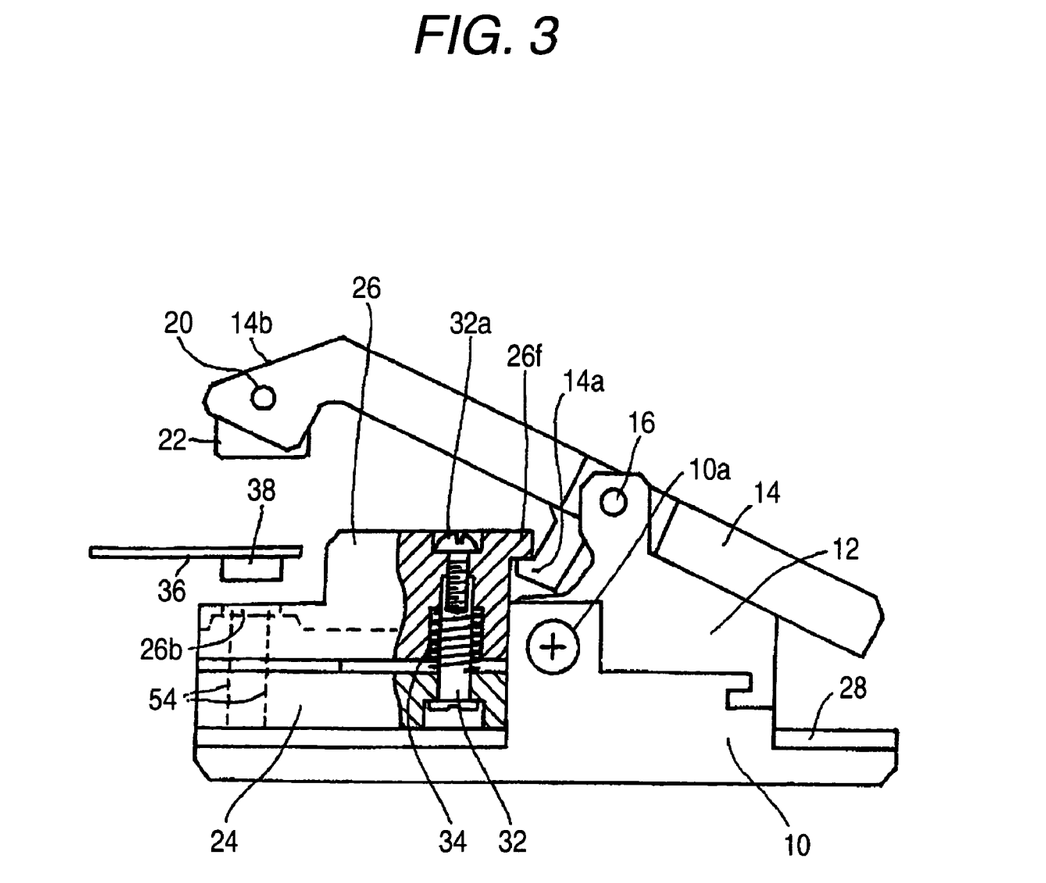
FIG. 3 is a side view of FIG. 1 in an open state.
Figure 4:
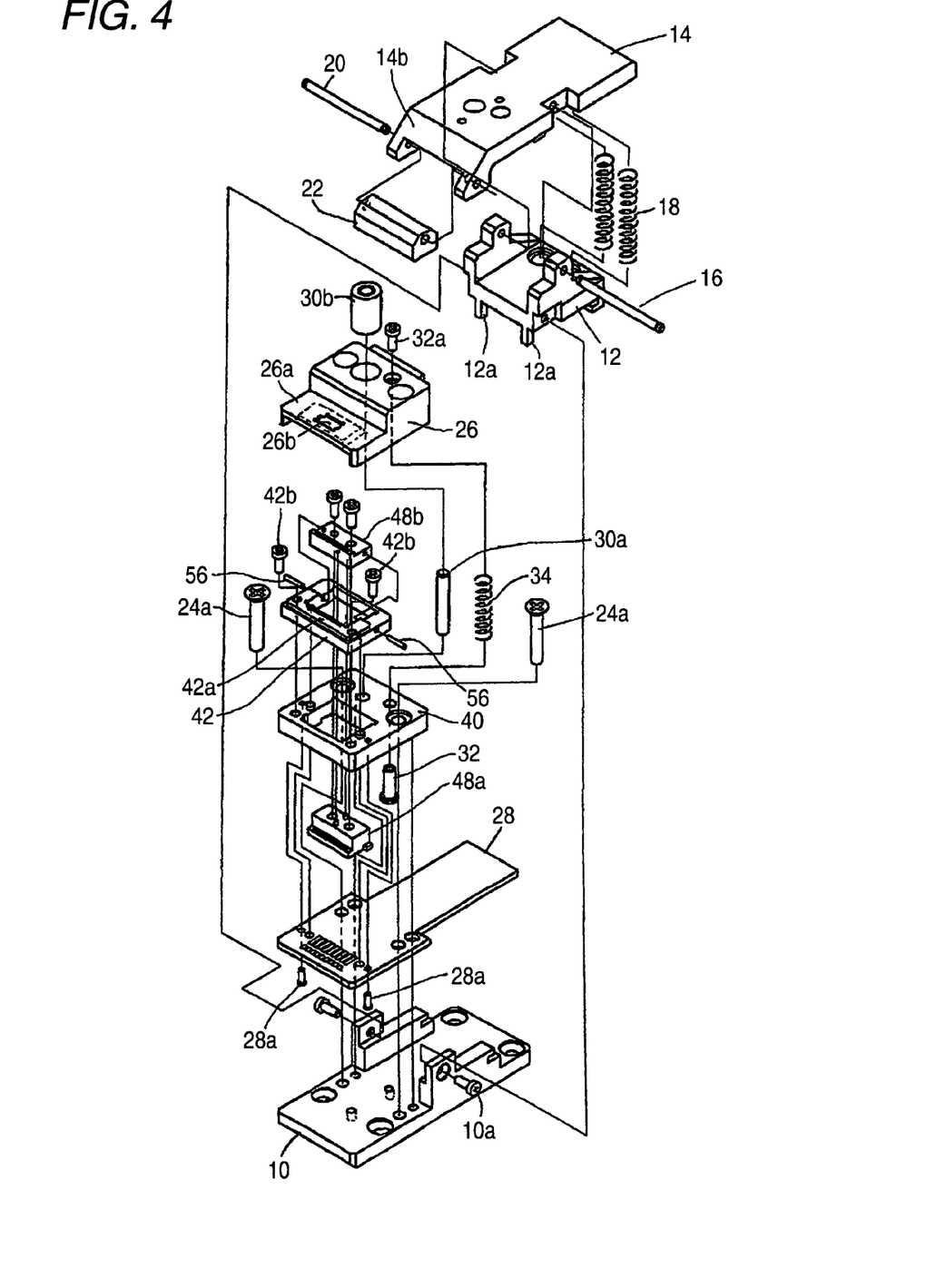
FIG. 4 is an exploded perspective view of FIG. 1.
Figure 5:
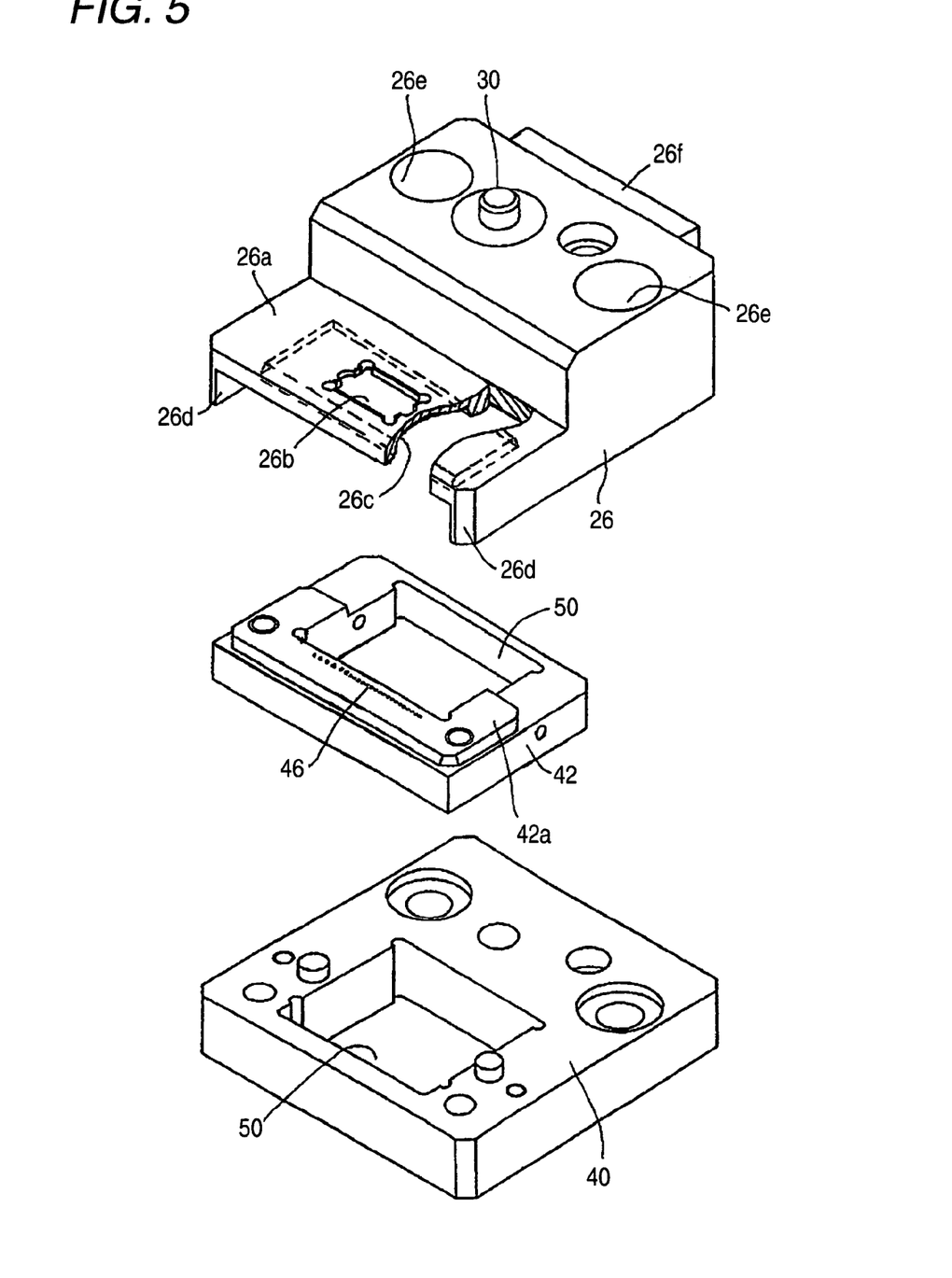
FIG. 5 is an exploded perspective view of upper and lower pin blocks and a floating guide.
Figure 6:
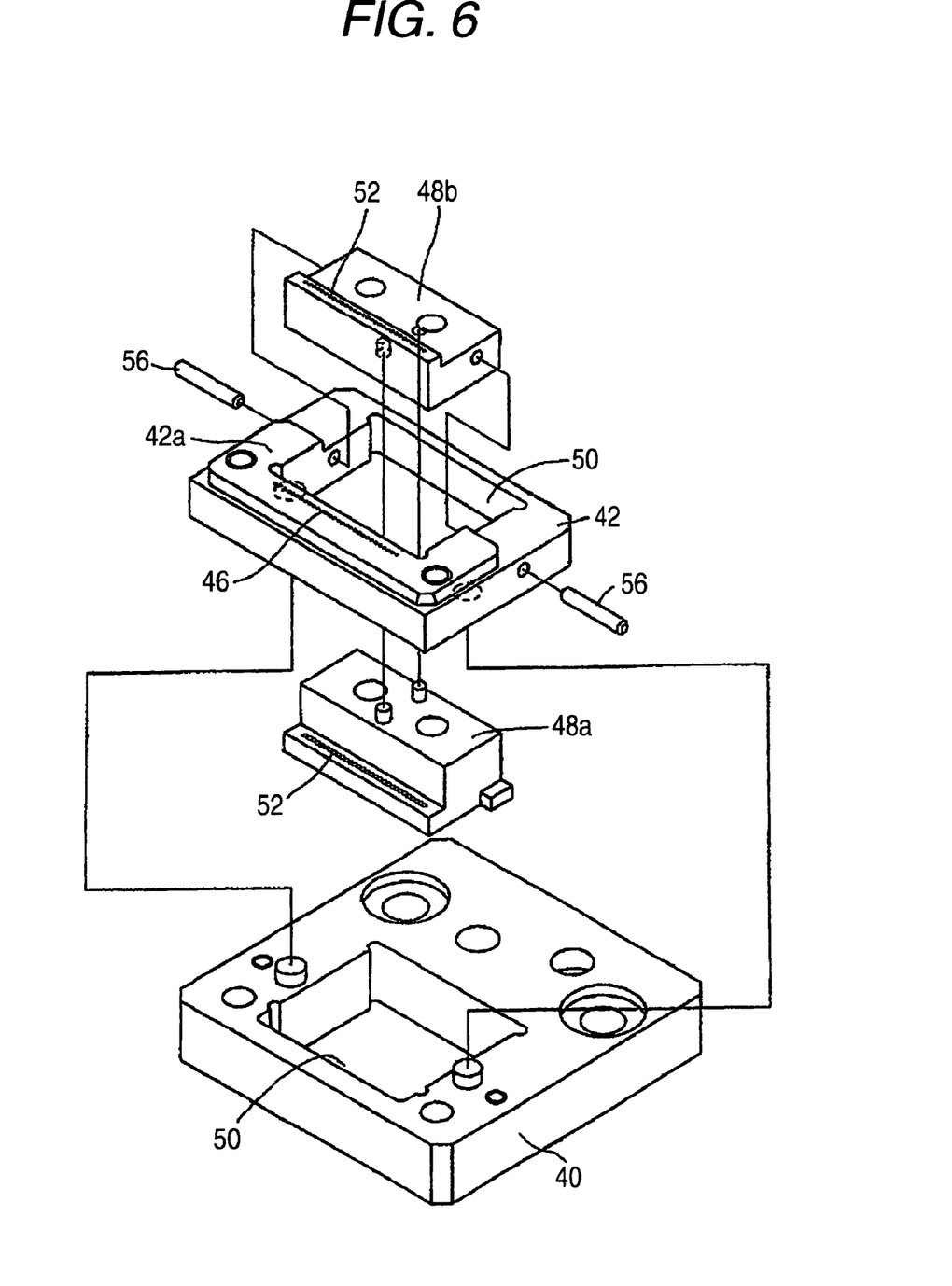
FIG. 6 is an exploded perspective view of the pin block.
Figure 7:
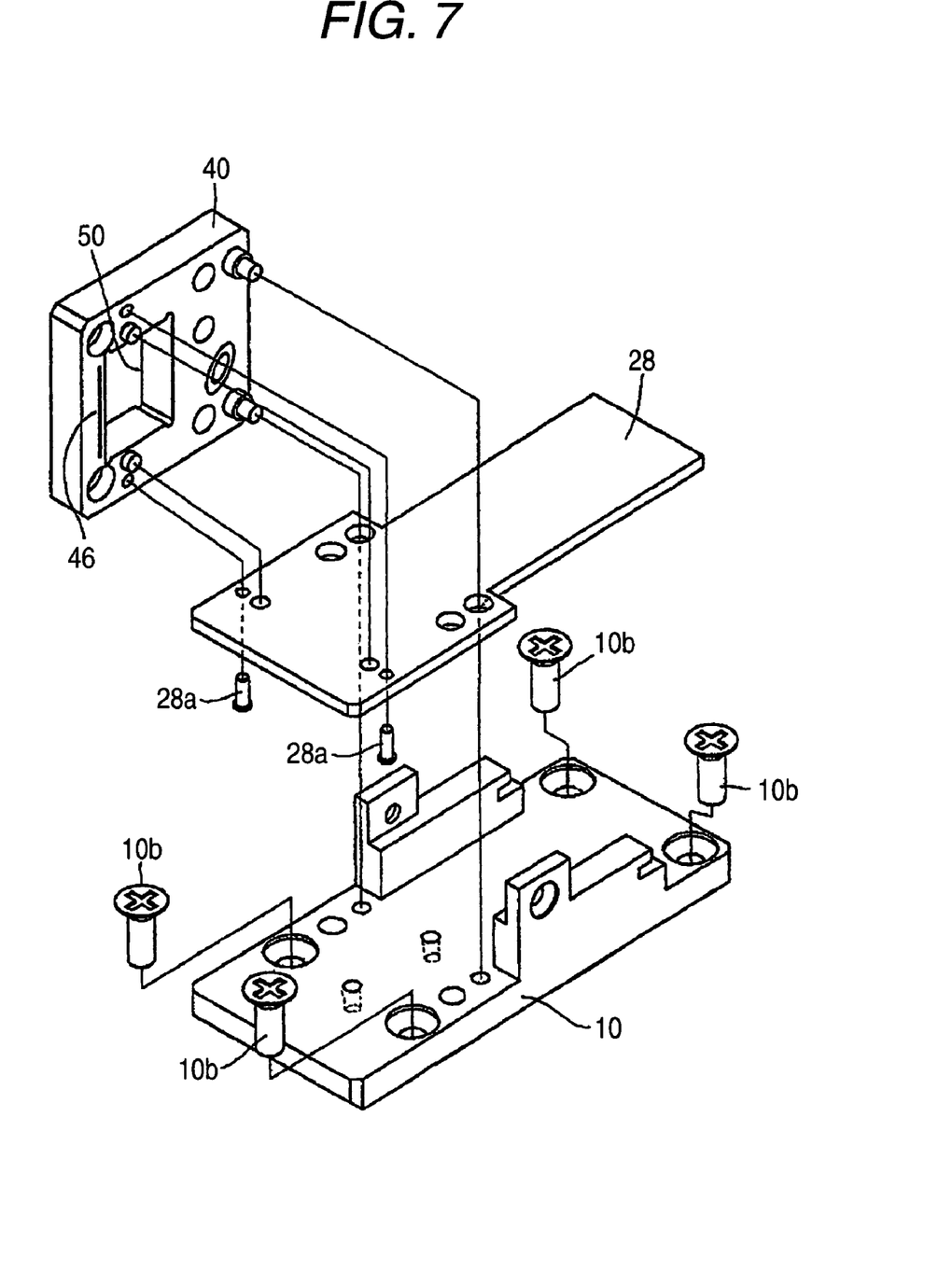
FIG. 7 is an exploded perspective view of the lower pin block, a wiring board, and a base member.

The floating guide 26 can move linearly in a vertical direction in FIGS. 1 and 3, in association with the swing motion of the distal end portion of the pressure operating member 14 between the open state in which the distal end portion is opened and the pressed state in which the distal end portion is closed. For this purpose, the pin block 24 is uprightly provided with a linear shaft 30a in a vertical direction, and the floating guide 26 is provided with a linear tube member 30b in a vertical direction, into which the linear shaft 30a is inserted so as to slide in an axial direction. This linear movement is realized by a linear guide 30 which includes the linear shaft 30a and the linear tube member 30b. A floating pin 32 having swelled parts at both ends is passed through the pin block 24 and the floating guide 26 in the vertical direction. A distance between the swelled parts at the both ends of the floating pin 32 can be adjusted by screwing an adjusting screw 32a which is provided at its one end. Further, a float spring 34 which is idly fitted to the floating pin 32 is provided between the pin block 24 and the floating guide 26 in a contracted state, and resiliently urges the floating guide 26 so as to separate it from the pin block 24. Accordingly, by adjusting the floating pin 32, the distance of the floating guide 26 to be separated from the pin block 24 is restricted as desired, and that, the floating guide 26 is urged by contracted resilience of the float spring 34, and kept in a state separated from the pin block 24 in the open state of the pressure operating member 14.

The floating guide 26 is provided with a board mounting face 26a on which a board 36 which is to be inspected is mounted. This board mounting face 26a is formed with a guide hole 26b into which a connector 38 to be inspected which is arranged on the board for inspection can be inserted and engaged. An outer peripheral wall of the connector 38 to be inspected is butted against an inner peripheral wall of this guide hole 26b, thereby to position the connector 38 to be inspected which has been inserted. The board mounting face 26a around this guide hole 26b has no such structure for restricting the position of the board 36 for inspection which has been mounted thereon, but has a sufficiently large flat face. The floating guide 26 is further provided with a concave part 26c, having its center substantially aligned with the guide hole 26b, on a back side of the board mounting face 26a. The board mounting face 26a is formed by cutting or so, while being adjusted so that a distance between a bottom face of the concave part 26c and the board mounting face 26a, that is, a depth of the guide hole 26b may be equal to a height of the connector 38 to be inspected. In addition, reinforcing ribs 26d for increasing mechanical strength are provided on the back face of the board mounting face 26a at both ends thereof.

Figure 8:
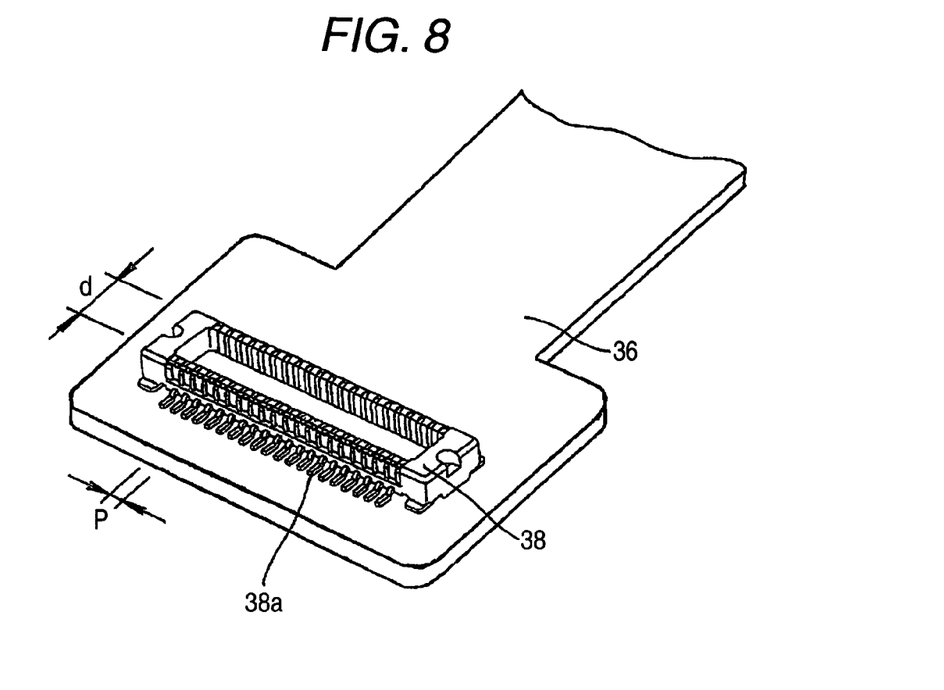
FIG. 8 is a perspective view of an outer appearance of a connector to be inspected which is provided on a board for inspection which is inspected by the relay connector according to the invention.

The pin block 24 includes a first pin block and a second pin block. A lower pin block 40 as the first pin block and an upper pin block 42 are integrally fixed to each other with screws 42b. The upper pin block 42 is provided with convex parts 42a projecting upward, which is so adapted as to be engaged with the concave part 26c of the floating guide 26 so that the floating guide 26 can be positioned with respect to the pin block 24. Moreover, a number of probe holes 46 passing through the lower pin block 40 and the upper pin block 42 in the vertical direction are formed in a row. Further, an insertion hole 50 into which a position adjusting block 48 formed of insulating material as the second block is inserted is formed passing through the lower pin block 40 and the upper pin block 42 in the vertical direction. The position adjusting block 48 also includes a lower position adjusting block 48a and an upper position adjusting block 48b which are integrally fixed to each other by appropriate means, and a number of probe holes 52 passing through them in the vertical direction are formed in a row. The position adjusting block 48 is adjusted inside the insertion hole 50 so that positions of the probe holes 52 may be at an appropriate distance from the probe holes 46 which are formed in the lower pin block 40 and the upper pin block 42, and fixed with positioning pins 56. It is to be noted that the position adjusting block 48 is set in the insertion hole 50 so as to move only in a direction of adjusting the distance between the probe holes 46 and 52, but cannot move in a direction perpendicular to this direction. The positioning pins 56 are passed through a wall of the insertion hole 50 in the upper pin block 42 and inserted into holes formed in the upper position adjusting block 48*b*, whereby a distance between the two rows of the probes 54 which are arranged in the probe holes 46, 52 is set to be equal to a distance d between two rows of the terminals on the connector 38 to be inspected. Each of the probe holes 46, 52 has a neck portion at its upper end so that a probe 54 can be appropriately inserted from below, but cannot escape upward. It is apparent that the probe holes 46, 52 are formed at a pitch corresponding to a pitch P of terminals 38*a* of the connector 38 to be inspected as shown in FIG. 8. Moreover, appropriate numbers of the probes 54 are inserted into the probe holes 46, 52 from below, at appropriate positions corresponding to the terminals 38*a* of the connector 38 to be inspected.

Figure 9:
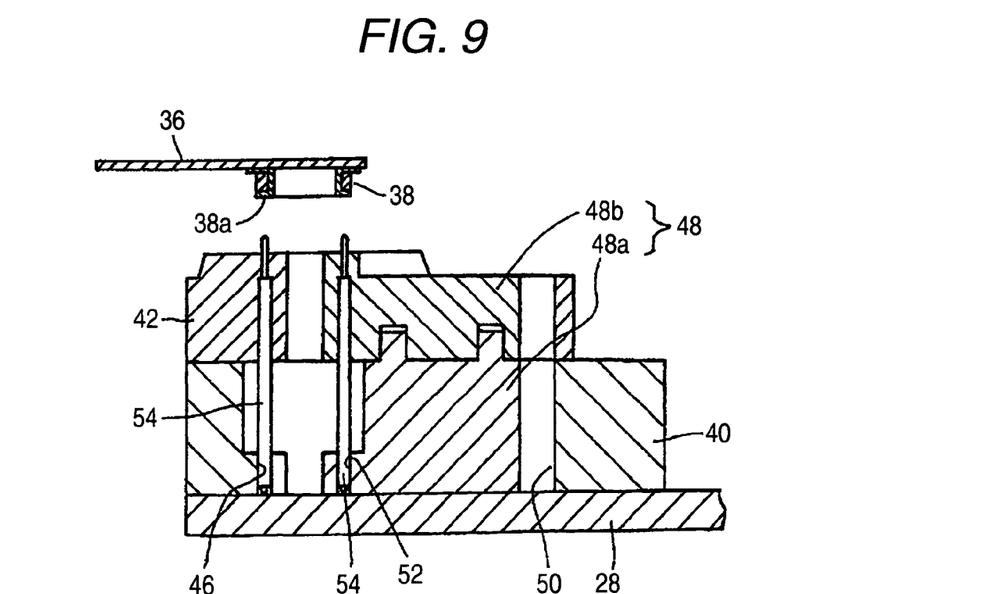
FIG. 9 is a vertical sectional view of the pin block.
Figure 10:
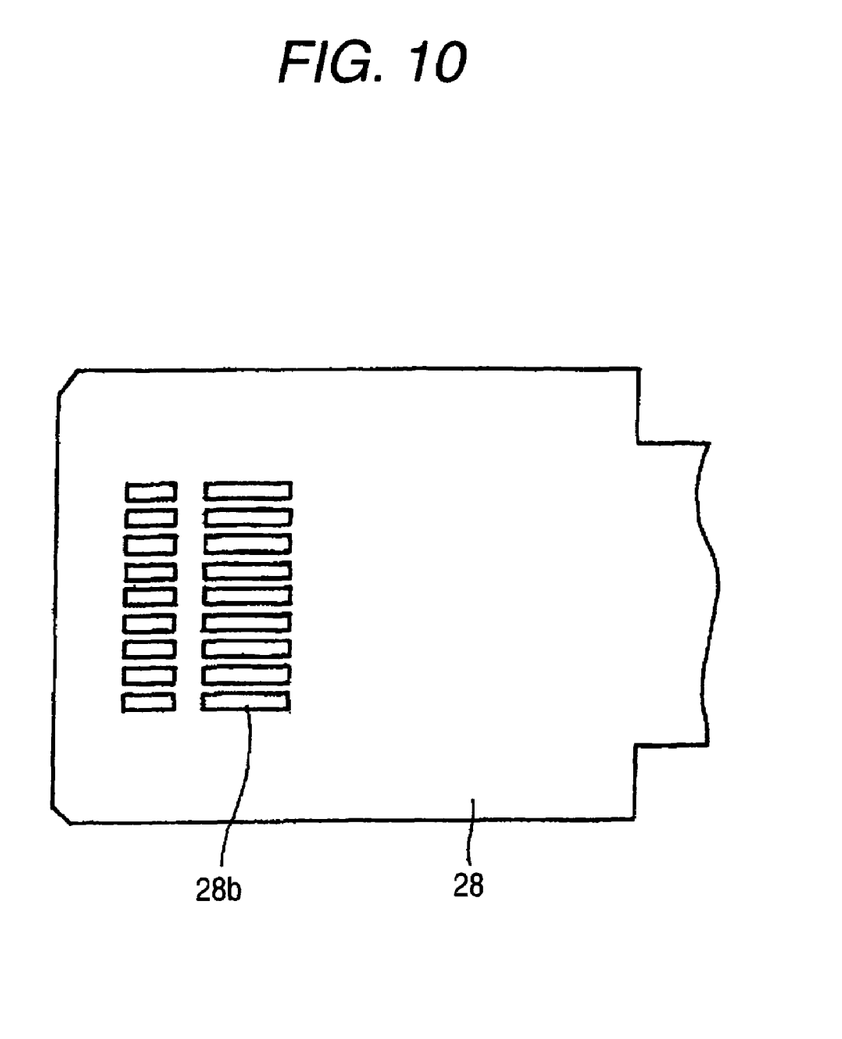
FIG. 10 is a view showing a terminal pattern which is provided on the wiring board.
Figure 11:
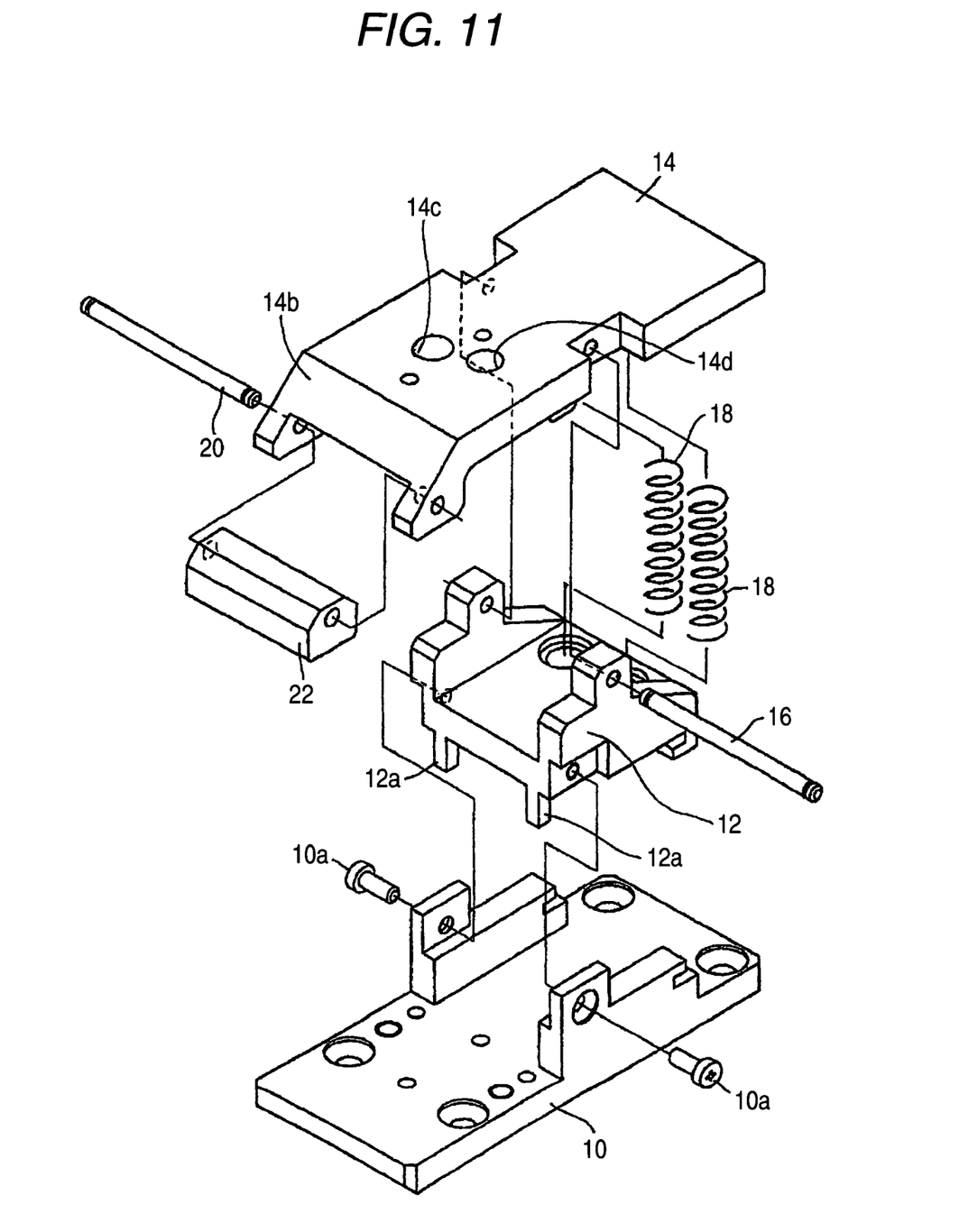
FIG. 11 is an exploded perspective view of a pressure operating member, a hinge member, and the base member.
Figure 12:
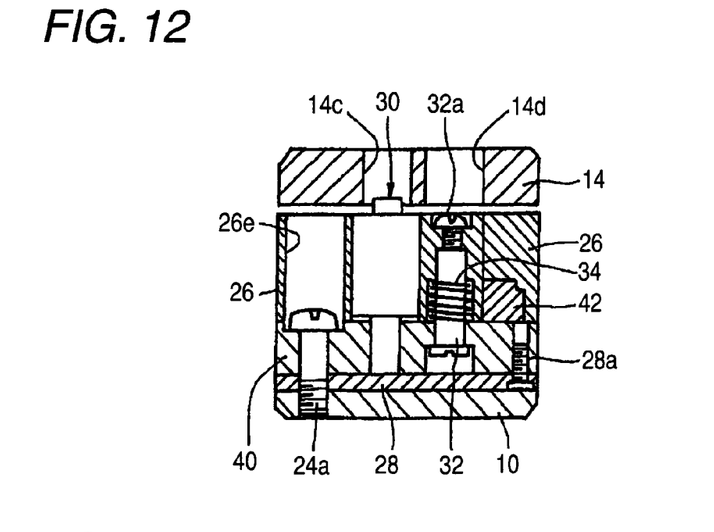
FIG. 12 is a sectional view as seen in a direction of arrow marks A-A in FIG. 2.

The wiring board 28 is integrally fixed to the pin block 24 which has the probes 54 inserted in the probe holes 46, 52, by arranging it from below and by screwing the screws 28*a* from below. By fixing the wiring board 28 in this manner, the probes 54 will not escape from the probe holes 46, 52. Then, the pin block 24 having the wiring board 28 fixed thereto is fixed to the base member 10 with the screws 24*a* from above. It is also possible to appropriately fix the base member 10 to an inspecting jig or the like which is not shown, in advance, with fixing screws 10*b*. As shown in FIG. 9, plungers of the probes 54 which have been inserted into the probe holes 46, 52 can be brought into contact with the terminals 38*a* of the connector 38 to be inspected which are shown in FIG. 8. A terminal pattern 28*b* provided on the wiring board 28 is formed longer in a moving direction of the position adjusting block 48 so that the terminal pattern 28*b* can be brought into contact with the plungers of the probes 54, even though the position adjusting block 48 has been moved.

Figure 13A:
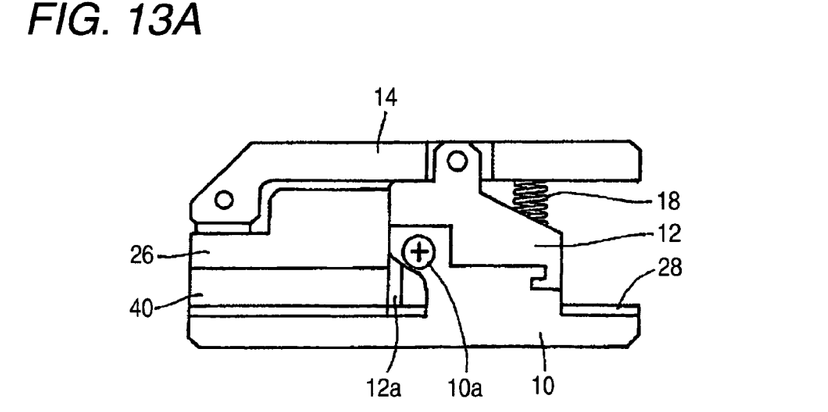
Figure 13B:
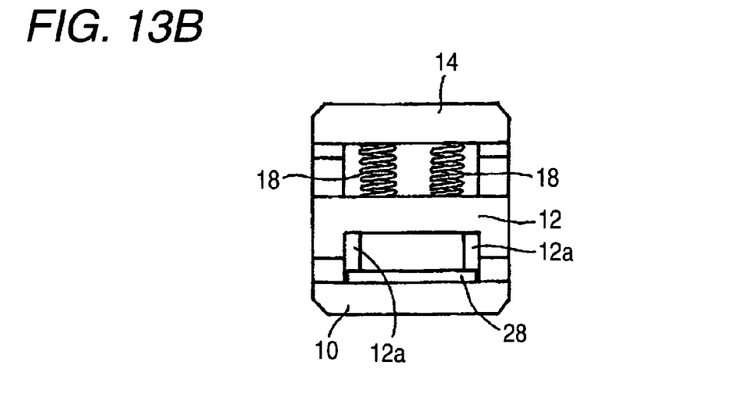

Further, the pressure operating member 14 which is provided so as to swing on the hinge member 12 is restrained by the hinge member 12 from moving in a swinging direction to be shifted into the open state. The aforesaid engaging projection 14*a* is so adapted as to be engaged with the engage receiving part 26*f*, in a state where the movement in the swinging direction into the open state is restrained. Moreover, the hinge member 12 is provided with ribs 12*a* as shown in FIGS. 13A and 13B, which act on the wiring board 28 to push it toward the base member 10, and restrain the wiring board 28 from floating up from the base member 10.

The pressure operating member 14 is provided with a hole 14*c* and an adjusting hole 14*d* so as to be respectively opposed to the linear guide 30 and the floating pin 32. The floating guide 26 is provided with holes 26*e* so as to be opposed to the screws 24*a* for fixing the pin block 24 having the wiring board 28 fixed thereto to the base member 10. Further, an upper part of the distal end portion of the pressure operating member 14 is chamfered to form a slant face 14*b*. The relay connector in the first embodiment according to the invention has a height of 27 mm, a width of 26 mm and a length of 60 mm in its outer shape, and can be held by hand to conduct inspecting work.

In the above described structure, the pressure operating member 14 is operated to swing against resilience of the compression spring 18, and shifted into the open state. Then, the board 36 for inspection is mounted on the board mounting face 26*a* of the floating guide 26, and the inspected-side connector 38 is inserted into the guide hole 26*b* to be engaged. By thus inserting the connector 38 to be inspected into the guide hole 26*b*, positioning of the connector 38 to be inspected is performed. On this occasion, a force for positioning the board 36 for inspection is not applied to the board 36 itself, and no force for displacing the position of the connector 38 to be inspected sideward with respect to the board 36 for inspection will be exerted. While the pressure operating member 14 is maintained in the open state, the engaging projection 14*a* of the pressure operating member 14 is engaged with the engage receiving part 26*f* of the floating guide 26, and so, the floating guide 26 will not move toward the pin block 24 unexpectedly. Therefore, there is no such anxiety that during the work for inserting the connector 38 to be inspected into the guide hole 26*b*, the floating guide 26 moves downward by mistake, and the probes 54 come into contact with the connector 38 to be inspected in an improper posture, whereby either of the connector 38 to be inspected and the probes 54 may be broken. When the pressure operating member 14 is shifted into the pressed state by closing the distal end by the resilience of the compression spring 18, the floating guide 26 is linearly moved toward the pin block 24 by the linear guide 30, and the plungers of the probes 54 are brought into contact with the terminals 38*a* of the connector 38 to be inspected. On this occasion, the concave part 26*c* of the floating guide 26 is engaged with the convex part 42*a* of the pin block 24, whereby the floating guide 26 and the pin block 24 are reliably positioned with respect to each other. As the results, the connector 38 to be inspected is positioned with respect to the pin block 24, and the terminals 38*a* are positioned with respect to the probes 54. It is apparent that the resilience of the compression spring 18 for urging the pressure operating member 14 into the pressed state is set to be larger than the resilience of the float spring 34 for separating the floating guide 26 from the pin block 24. Besides, because the depth of the guide hole 26*b* in the floating guide 26 is so set as to be equal to the height of the connector 38 to be inspected, the face of the connector 38 to be inspected which has been inserted into the guide hole 26*b* at the side opposed to the pin block 24 lies on the same plane as the bottom face of the concave part 26*c*. By providing the probes 54 in such a manner that a projecting height of the plungers may be optimum, making the bottom face of the concave part 26*c* as a base, the plungers of the probes 54 can be brought into contact with the terminals 38*a* of the connector 38 to be inspected with appropriate resilience.

The pressure operating member 14 is so constructed as to swing between the open state and the pressed state by means of the swing shaft 16, and has the relatively simple structure. Besides, the pressure block 22 is provided at the distal end side of the pressure operating member 14 by means of the second swing shaft 20, and so, the floating guide 26 can be accurately pressed by this pressure block 22 in a direction of approaching the pin block 24.

By the way, for the purpose of arranging the relay connector according to the invention in alignment with the connector 38 to be inspected having various different sizes, the size and depth of the guide hole 26*b* in the floating guide 26 is appropriately adjusted and set depending on the connector 38 to be inspected, as a first step. The depth of the guide hole 26*b* can be adjusted by adequately cutting the board mounting face 26*a*. In the pin block 24 too, the distance between the two rows of the probe holes 46 and 52 is made equal to a distance between the two rows of the terminals 38*a* of the connector 38 to be inspected, by appropriately setting the position of the position adjusting block 48 to be fixed inside the insertion hole 50. This can be done easily and rapidly, by accurately drilling either one or both of the holes which are formed in the wall of the insertion hole 50 in the upper pin block 42 for inserting the positioning pins 56, and the holes which are formed in the upper position adjusting block 48b. It is apparent that the probes 54 must be inserted into the probe holes 46, 52 so as to be opposed to the terminals 38a of the connector 38 to be inspected. In this manner, the work for arranging the relay connector according to the invention in alignment with the connector 38 to be inspected having various different sizes can be conducted relatively easily, by preparing the respective members just before the final process, in advance, and the work can be rapidly conducted, as compared with the case where the respective members are newly produced.

The distance of the floating guide 26 moving in the separating direction from the pin block 24 can be arbitrarily adjusted by means of the floating pin 32. In case where the distance of the floating guide 26 moving in the separating direction from the pin block 24 has changed due to long use, a screwed and inserted state of the adjusting screw 32a of the floating pin 32 may be adjusted by appropriately inserting a tool through the adjusting hole 14d which is formed in the pressure operating member 14. In case where the probes 54 are broken and must be exchanged, the hinge member 12 in a state when the pressure operating member 14 is attached therewith is detached from the base member 10, and the screws 24a are removed from the base member 10, by inserting a tool through the holes 26e which are formed in the floating guide 26. Then, the pin block 24 which has/been detached is turned upside down having the wiring board 28 placed on an upper side, and the wiring board 28 is detached from the pin block 24, by removing the screws 28a. Thereafter, only the probes 54 that must be exchanged may be taken out of the probe holes 46, 52 and exchanged.

Figure 14:
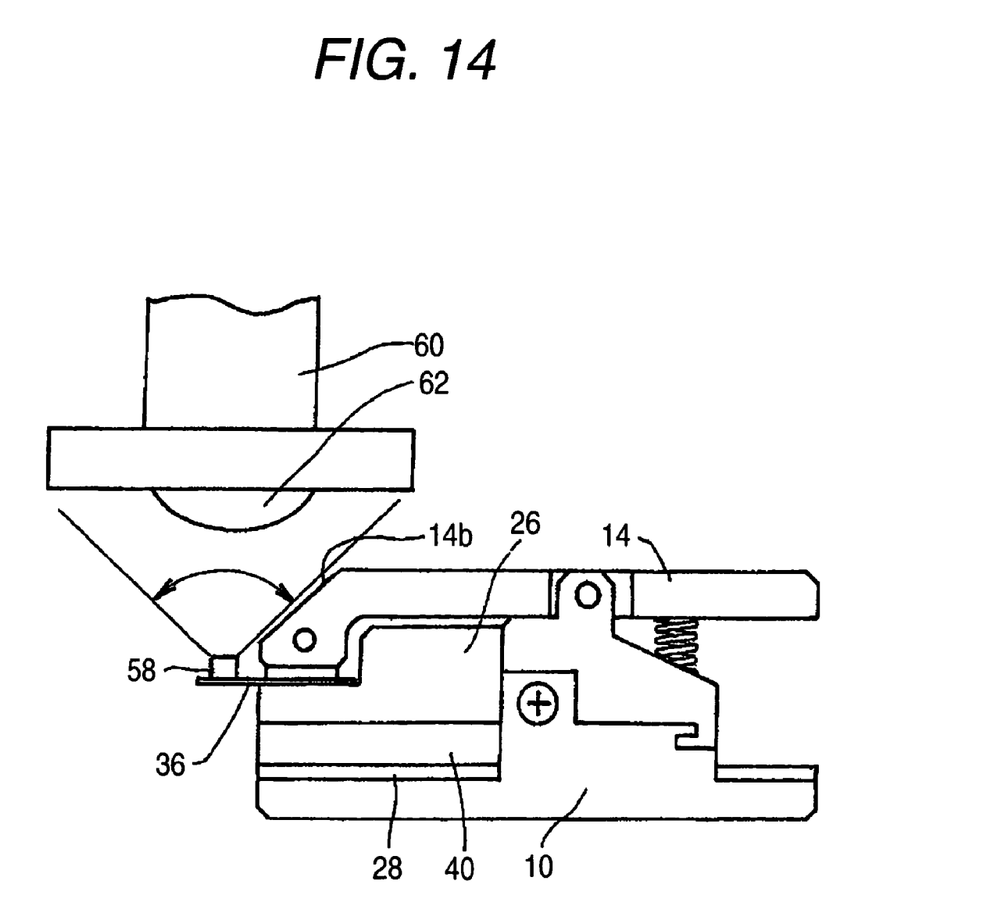
FIG. 14 is a view for explaining function of a slant face which is formed by chamfering an upper part of a distal end of the pressure operating member.

There is such anxiety that the wiring board 28 which is fixed to the pin block 24 with the screws 28a may be distorted with soldering heat or so, and its backward end may float from the base member 10. For avoiding such anxiety, the wiring board 28 is so constructed as to be pushed toward the base member 10 by means of the ribs 12a which are provided on the hinge member 12. Moreover, in case where the board 36 for inspection is a camera module, a CCD camera element 58 is disposed on the board 36 for inspection at the other end thereof, that is, at the opposite side to the side where the connector 38 to be inspected is provided. In some cases, the CCD camera element 58 is positioned relatively close to the connector 38 to be inspected, as shown in FIG. 14. Because the slant face 14b is formed by chamfering the upper distal part of the pressure operating member 14, a field of view above the CCD camera element 58 is widely opened. As the results, it is possible to direct this CCD camera element 58 to a lens 62 which is provided in an inspection unit 60 for inspecting the CCD camera element 58, without any obstacle in the field of view.

Figure 15:
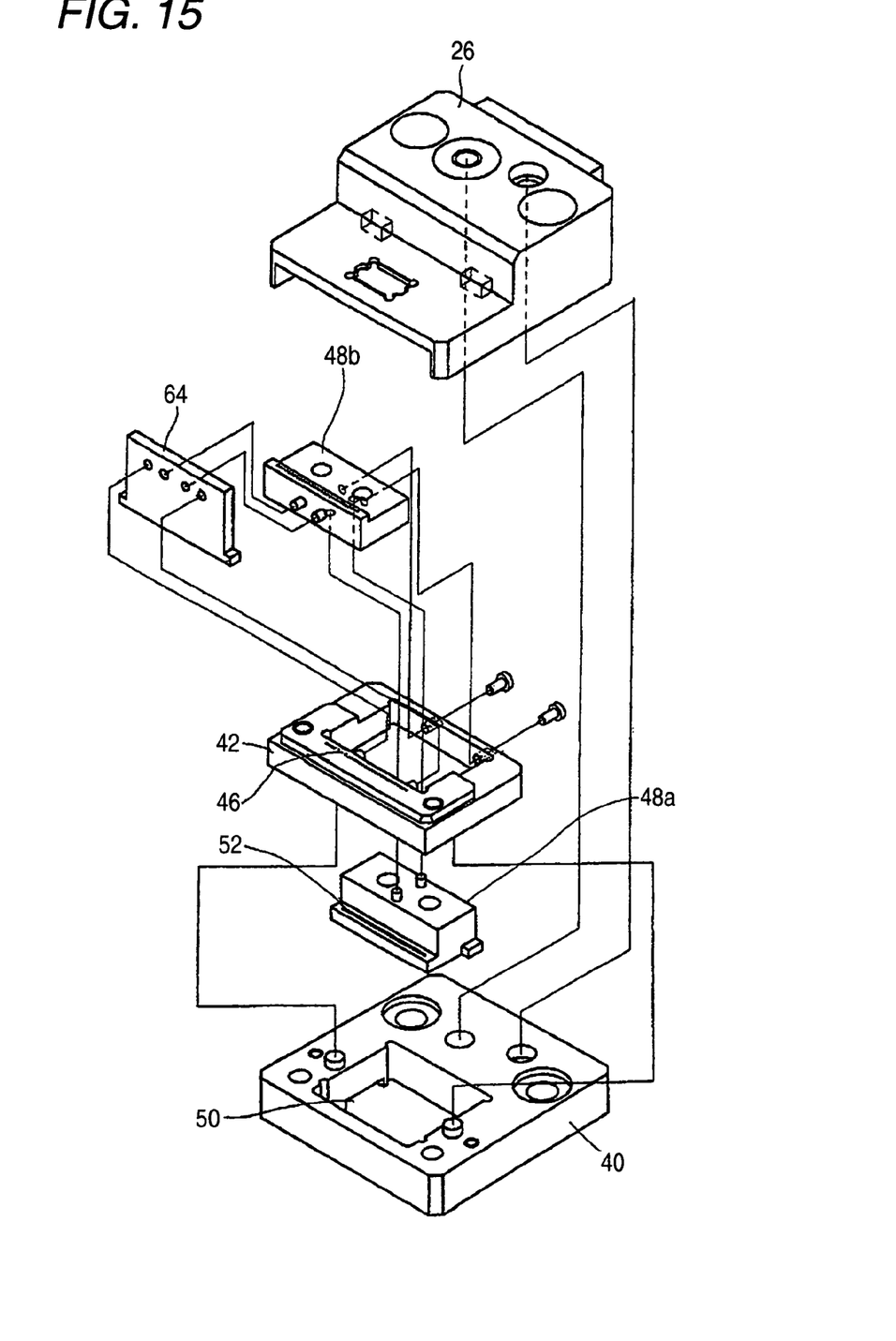
FIG. 15 is an exploded perspective view of a pin block in a relay connector in a second embodiment according to the invention.

Then, a second embodiment of the invention will be described referring to FIG. 15. In FIG. 15, the members which are the same as or equivalent to those members as shown in FIGS. 1 to 14 will be denoted with the same reference numerals, and overlapped descriptions will be omitted.

The relay connector in the second embodiment of the invention as shown in FIG. 15 is the same as the relay connector in the first embodiment in that the pin block 24 includes the first pin block and the second pin block, that the lower pin block 40 as the first pin block and the upper pin block 42 are integrally fixed to each other, and that the position adjusting block 48 as the second pin block is formed by integrally fixing the lower position adjusting block 48a and the upper position adjusting block 48b to each other. The relay connector in the second embodiment is also the same as in the first embodiment in that the insertion hole 50 is formed passing through the lower pin block 40 and the upper pin block 42 in the vertical direction, that the position adjusting block 48 is inserted into this insertion hole 50, and that they can approach and separate relatively so that the distance between the probe holes 52 and the probe holes 46 which are formed in the lower pin block 40 and the upper pin block 42 may become optimum. The second embodiment is different from the first embodiment in that a spacer 64 is interposed between an inner wall of the insertion hole 50 adjacent to the probe holes 46 which are formed in the lower pin block 40 and the upper pin block 42 in a direction of approaching and separating, and the position adjusting block 48, whereby the position adjusting block 48 is pressed and fixed to the inner wall of the insertion hole 50 with pressure of screws from the other side. By appropriately adjusting thickness of this spacer 64, the position adjusting block 48 is adjusted in position, and fixed to the lower pin block 40 and the upper pin block 42. Flange portions are respectively provided on lower ends of the spacer 64 and the lower position adjusting block 48a so as to protrude in a direction perpendicular to the approaching and separating direction. These flange portions are engaged with flange receiving parts provided on the lower end of the lower pin block 40 so that the spacer 64 and the position adjusting block 48 may not be displaced upward. Moreover, the floating guide 26 which relatively moves in the vertical direction may be appropriately formed with a cut-out, according to necessity, for avoiding interference with the screws for pressing the position adjusting block 48.

In the second embodiment, the position of the position adjusting block 48 as the second pin block can be adjusted by adjusting the thickness of the spacer 64. Accordingly, by conducting a work for adjusting the thickness of the spacer 64 according to the distance between the terminals 38a of the relevant connector 38 to be inspected, at a time point when the connector 38 to be inspected has been set, the relay connector can be produced easily and rapidly. A manner of fixing the spacer 64 and the position adjusting block 48 is not limited to the manner in the above described embodiment. It is also possible to fasten them together with a screw which is passed through both the position adjusting block 48 and the spacer 64 and screwed on the upper pin block 42.

According to an aspect of the invention, the probes are provided in the first pin block and the second pin block so as to be contacted respectively with the terminals arranged in a row on the connector to be inspected, and the first and second pin blocks are fixed in such a manner that they can approach and separate with respect to each other according to the distance between the two rows of the terminals on the connector to be inspected, and that the distance between them can be adjusted. Therefore, the relay connector can be produced easily and rapidly, by producing the first and second pin blocks, in advance, nearly to a finished product, and by conducting a work for fixing the second pin block to the first pin block according to the distance between the terminals on the connector to be inspected, at a time point when the connector to be inspected has been set.

According to an aspect of the invention, the first pin block is formed with the insertion hole into which the second pin block is inserted so as to move only in the approaching and separating direction, the position of the second pin block being adjusted in a state inserted into the insertion hole, and the positioning pin which is perpendicular to the approaching and separating direction is inserted into the second pin block, by passing it through the wall of the insertion hole from outside of the insertion hole, whereby the second pin block is fixed to the first pin block. Therefore, the relay connector can be produced, by forming a hole for inserting the positioning pin in the second block, and at the same time, by forming a hole for inserting the positioning pin in the outer wall of the insertion hole in the first pin block, according to the distance between the terminals on the connector to be inspected, at a time point when the connector to be inspected has been set.

According to an aspect of the invention, the first pin block is formed with the insertion hole into which the second pin block is inserted so as to move only in the approaching and separating direction, and the spacer is interposed between the inner wall of the insertion hole at one side in the approaching and separating direction, the position of the second pin block being adjusted by adjusting the thickness of the spacer. Therefore, the relay connector can be produced, by conducting a work for adjusting the thickness of the spacer according to the distance between the terminals on the connector to be inspected, at a time point when the connector to be inspected has been set.

What is claimed is:

1. A relay connector, adapted to electrically connect terminals which are arranged in two rows on a connector to be inspected provided on a board for inspection to a measuring instrument, the relay connector comprising:
    first probes, mounted on a first pin block comprised of insulating material so as to be contacted with one row of the terminals arranged on the connector to be inspected, and
    second probes, mounted on a second pin block comprised of insulating material so as to be contacted with the other row of the terminals arranged on the connector to be inspected, wherein
    the first and second pin blocks are free to approach and separate with respect to each other in a direction such that a distance between the first and second pin blocks is adjusted and fixed, so that the first and second probes are respectively contacted with the terminals which are arranged in two rows on the connector to be inspected.

2. A relay connector, adapted to electrically connect terminals which are arranged in two rows on a connector to be inspected provided on a board to a measuring instrument, the relay connector comprising:
    first probes, mounted on a first pin block comprised of insulating material so as to be contacted with one row of the terminals arranged on the connector to be inspected, and
    second probes, mounted on a second pin block comprised of insulating material so as to be contacted with the other row of the terminals arranged on the connector to be inspected, wherein
    the first pin block is formed with an insertion hole into which the second pin block is inserted so as to move only in a direction in which the first and second pin blocks approaches and separates with respect to each other,
    a position of the second pin block is adjusted in a state that the second pin block is inserted into the insertion hole, and
    a positioning pin perpendicular to the direction is inserted into the second pin block by passing through a wall of the insertion hole from outside of the insertion hole, whereby
    the second pin block is fixed to the first pin block.

3. The relay connector as claimed in claim 2, wherein
    the first and second pin blocks are free to approach and separate with respect to each other in a direction such that a distance between the first and second pin blocks is adjusted and fixed, so that the first and second probes are respectively contacted with the terminals which are arranged in two rows on the connector to be inspected.

4. The relay connector as claimed in claim 2, wherein
    the board is a board for inspection.

5. A relay connector, adapted to electrically connect terminals which are arranged in two rows on a connector to be inspected provided on a board to a measuring instrument, the relay connector comprising:
    first probes, mounted on a first pin block comprised of insulating material so as to be contacted with one row of the terminals arranged on the connector to be inspected, and
    second probes, mounted on a second pin block comprised of insulating material so as to be contacted with the other row of the terminals arranged on the connector to be inspected, wherein
    the first pin block is formed with an insertion hole into which the second pin block is inserted so as to move only in a direction in which the first and second pin blocks approaches and separates with respect to each other,
    a spacer is interposed between an inner wall of the insertion hole at one side in the direction and the second pin block, and
    a position of the second pin block is adjusted by adjusting a thickness of said spacer, whereby
    the second pin block is fixed to the first pin block.

6. The relay connector as claimed in claim 5, wherein
    the board is a board for inspection.

7. The relay connector as claimed in claim 5, wherein
    the first and second pin blocks are free to approach and separate with respect to each other in a direction such that a distance between the first and second pin blocks is adjusted and fixed, so that the first and second probes are respectively contacted with the terminals which are arranged in two rows on the connector to be inspected.

* * * * *